(12) United States Patent
Itoh et al.

(10) Patent No.: US 12,315,700 B2
(45) Date of Patent: May 27, 2025

(54) PLASMA PROCESSING APPARATUS AND CEILING WALL

(71) Applicant: Tokyo Electron Limited, Tokyo (JP)

(72) Inventors: Satoshi Itoh, Yamanashi (JP); Masashi Imanaka, Yamanashi (JP); Eiki Kamata, Yamanashi (JP); Taro Ikeda, Yamanashi (JP); Shigenori Ozaki, Osaka (JP); Soudai Emori, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 526 days.

(21) Appl. No.: 17/766,379

(22) PCT Filed: Sep. 25, 2020

(86) PCT No.: PCT/JP2020/036334
§ 371 (c)(1),
(2) Date: Apr. 4, 2022

(87) PCT Pub. No.: WO2021/070636
PCT Pub. Date: Apr. 15, 2021

(65) Prior Publication Data
US 2023/0343561 A1 Oct. 26, 2023

(30) Foreign Application Priority Data
Oct. 8, 2019 (JP) .................... 2019-185445

(51) Int. Cl.
*H01J 37/32* (2006.01)

(52) U.S. Cl.
CPC .. *H01J 37/32458* (2013.01); *H01J 37/32238* (2013.01); *H01J 2237/327* (2013.01)

(58) Field of Classification Search
CPC ........... H01J 2237/327; H01J 37/32458; H01J 37/32238
(Continued)

(56) References Cited

U.S. PATENT DOCUMENTS 6,325,018 B1 * 12/2001 Hongoh .................... H05H 1/46
118/723 AN
2004/0149741 A1 * 8/2004 Ishii ........................ H05B 6/806
219/678

(Continued)

FOREIGN PATENT DOCUMENTS

JP 2006-40638 A 2/2006
JP 2019-106358 A 6/2019
(Continued)

*Primary Examiner* — Charlee J. C. Bennett
(74) *Attorney, Agent, or Firm* — Nath, Goldberg & Meyer; Jerald L. Meyer; Tanya E. Harkins

(57) ABSTRACT

There is provided a plasma processing apparatus that converts a gas supplied into a processing container into a plasma to process a substrate, the plasma processing apparatus including: a microwave introduction window disposed in each of a plurality of openings formed in a ceiling wall of the processing container, the microwave introduction window being configured to supply power of microwaves into the processing container; and a plurality of grooves formed on the ceiling wall to surround the openings respectively, wherein widths between the grooves and the openings are not uniform with respect to circumferential directions of the openings.

15 Claims, 11 Drawing Sheets

(58) Field of Classification Search
USPC .................................................. 156/345.33
See application file for complete search history.

(56) References Cited

U.S. PATENT DOCUMENTS

| | | | |
|---|---|---|---|
| 2008/0035058 A1* | 2/2008 | Tian | H01J 37/32211 |
| | | | 118/723 AN |
| 2010/0183827 A1* | 7/2010 | Hirayama | B05C 13/00 |
| | | | 427/575 |
| 2012/0180953 A1* | 7/2012 | Ozaki | H01J 37/32192 |
| | | | 118/723 R |
| 2015/0212127 A1* | 7/2015 | Ikeda | G01R 27/28 |
| | | | 324/638 |
| 2015/0348761 A1* | 12/2015 | Zhao | H01J 37/32238 |
| | | | 156/345.48 |
| 2023/0005720 A1* | 1/2023 | Ikeda | C23C 16/345 |

FOREIGN PATENT DOCUMENTS

| | | |
|---|---|---|
| KR | 1020100020974 A | 2/2010 |
| KR | 1020190071609 A | 6/2019 |
| WO | 2008/153064 A1 | 12/2008 |

\* cited by examiner

FIG. 4A
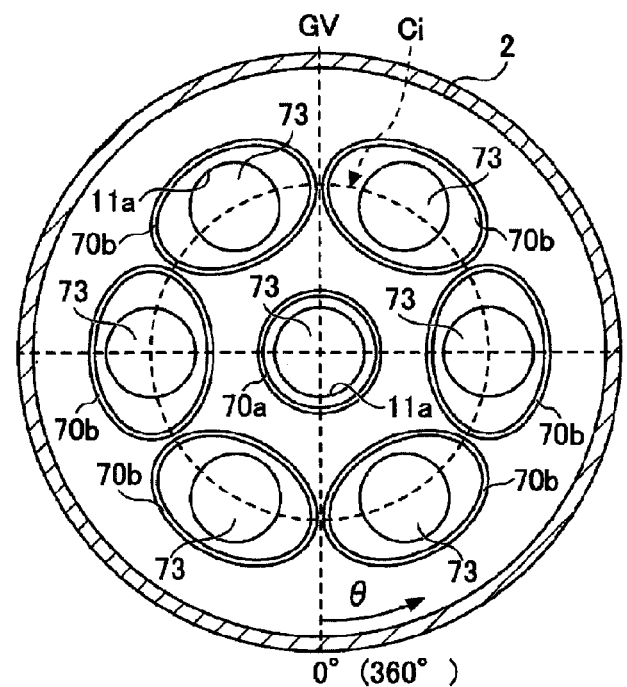
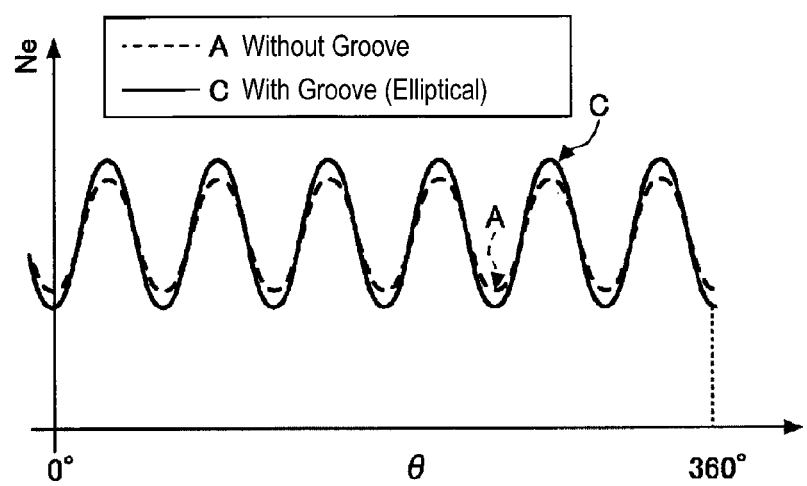

FIG. 4B
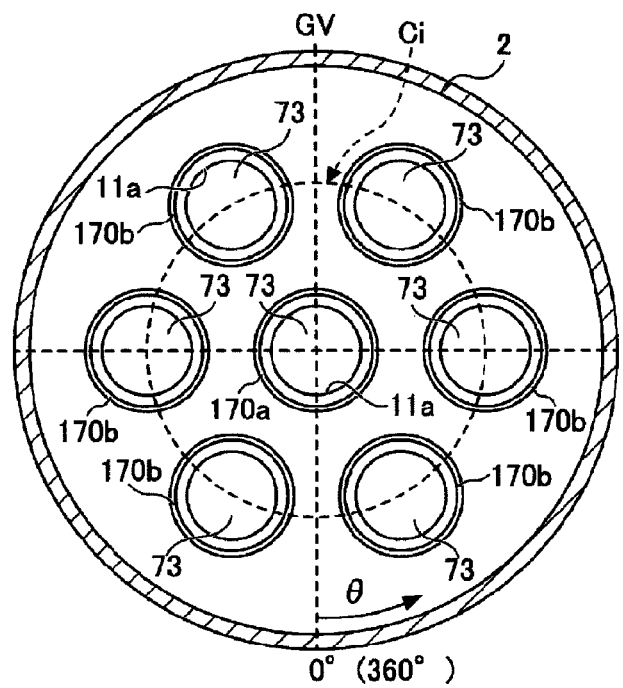
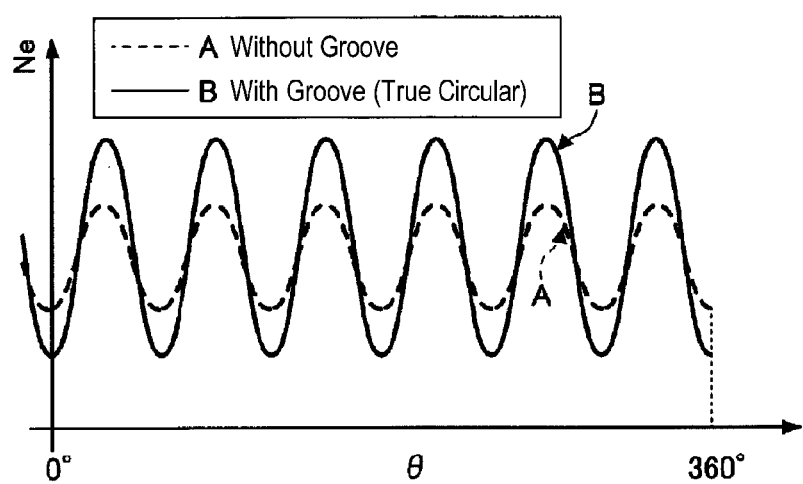

FIG. 5A
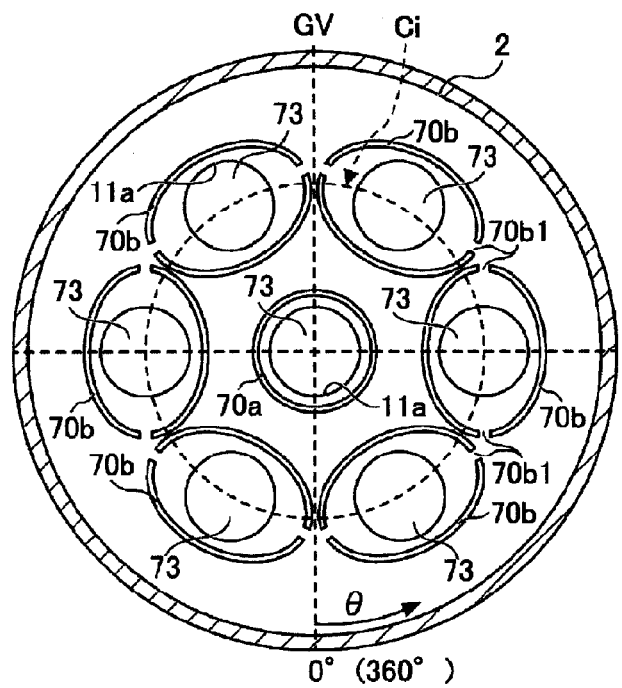
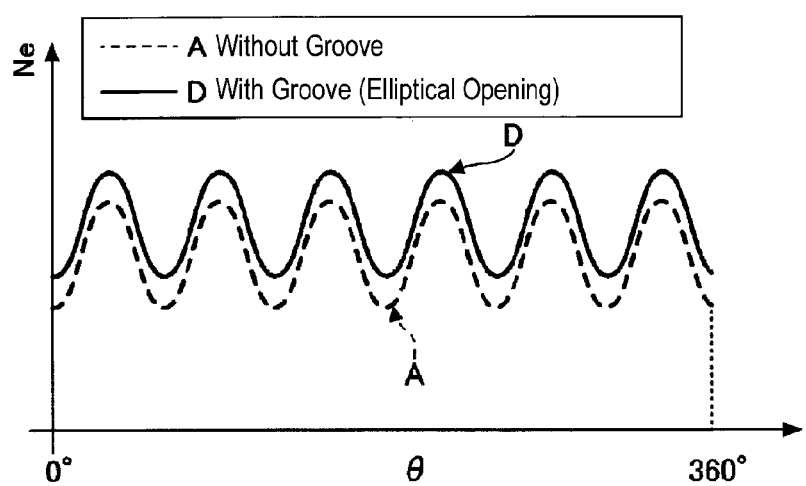

FIG. 5B
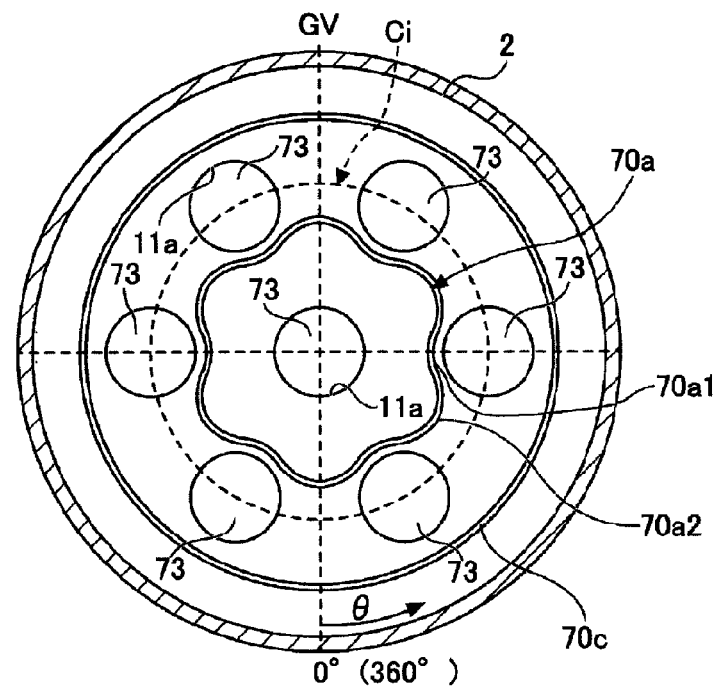
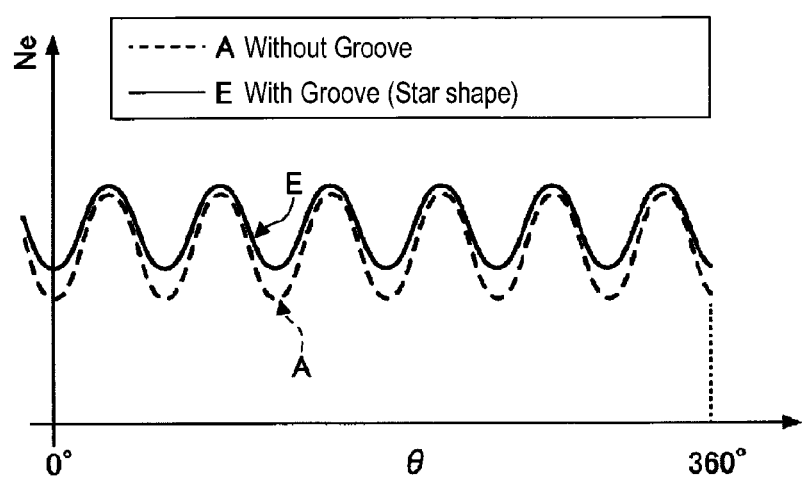

FIG. 6A
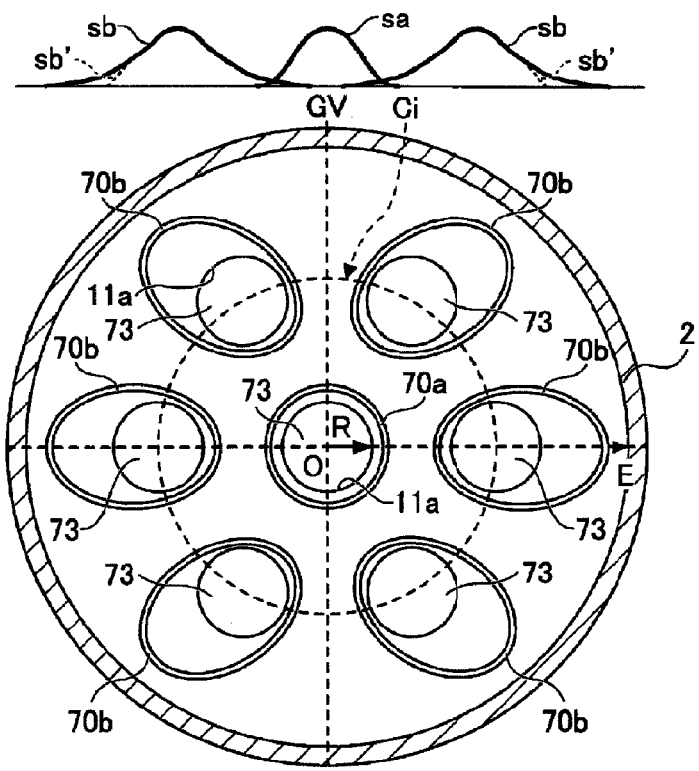
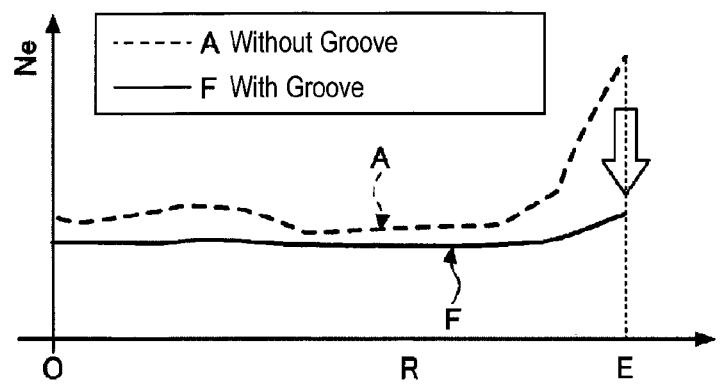

FIG. 6B
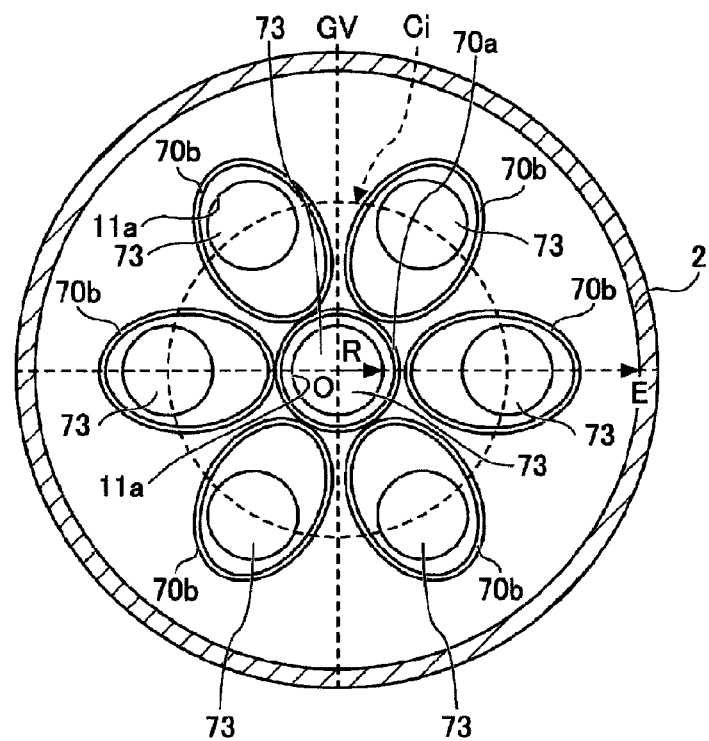
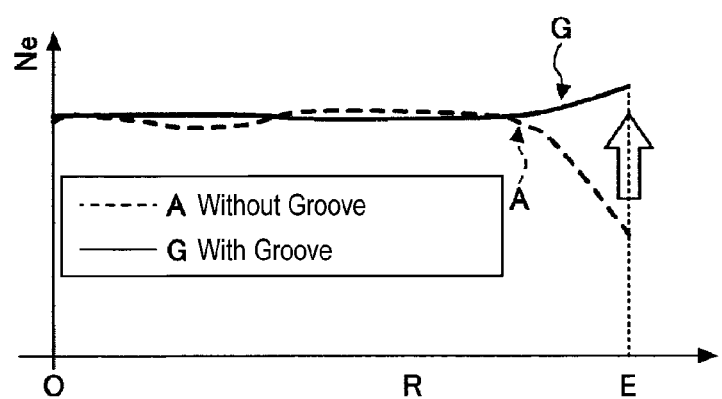

PLASMA PROCESSING APPARATUS AND CEILING WALL

This is a National Phase application filed under 35 U.S.C. 371 as a national stage of PCT/JP2020/036334, filed Sep. 25, 2020, an application claiming the benefit of Japanese Application No. 2019-185445, filed Oct. 8, 2019 the content of each of which is hereby incorporated by reference in its entirety.

TECHNICAL FIELD

The present disclosure relates to a plasma processing apparatus and a ceiling wall.

BACKGROUND

For example, Patent Document 1 proposes to increase a plasma intensity by providing a microwave transmission member in an opening of a ceiling wall, forming a groove similar to the opening around the opening of the ceiling wall to block propagation of surface waves of microwaves, and controlling an electric field distribution of surface wave plasma by an arrangement of the groove.

PRIOR ART DOCUMENT

Patent Document

Patent Document 1: Japanese Laid-Open Patent Publication No. 2019-106358

SUMMARY

The present disclosure provides a plasma processing apparatus and a ceiling wall capable of achieving a uniform plasma density distribution.

An aspect of the present disclosure provides a plasma processing apparatus that converts a gas supplied into a processing container into a plasma to process a substrate, the plasma processing apparatus including: a microwave introduction window disposed in each of a plurality of openings formed in a ceiling wall of the processing container, the microwave introduction window being configured to supply power of microwaves into the processing container; and a plurality of grooves formed on the ceiling wall to surround the openings respectively, wherein widths between the grooves and the openings are not uniform with respect to circumferential directions of the openings.

According to an aspect of the present disclosure, it is possible to achieve a uniform plasma density distribution.

BRIEF DESCRIPTION OF DRAWINGS

FIG. 4A is a view illustrating an example of grooves in a ceiling wall according to an embodiment of the present disclosure.

FIG. 4B is a view illustrating an example of grooves in a ceiling wall according to a comparative example.

FIG. 5A is a view illustrating another example of grooves in a ceiling wall according to an embodiment of the present disclosure.

FIG. 5B is a view illustrating another example of grooves in a ceiling wall according to an embodiment of the present disclosure.

FIG. 6A is a view illustrating another example of grooves in a ceiling wall according to an embodiment of the present disclosure.

FIG. 6B is a view illustrating another example of grooves in a ceiling wall according to an embodiment of the present disclosure.

DETAILED DESCRIPTION

Figure 1:
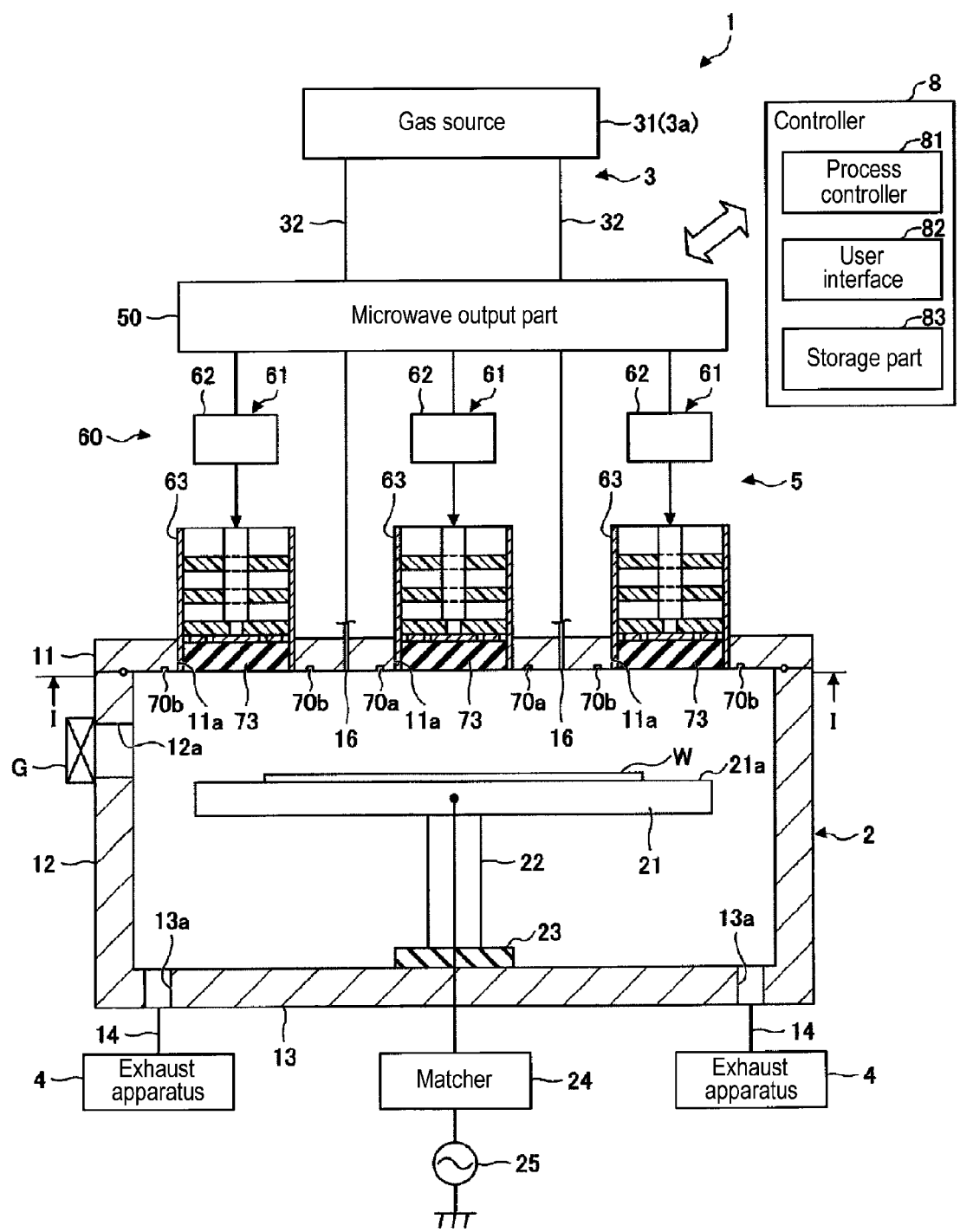
FIG. 1 is a view illustrating an example of a plasma processing apparatus according to an embodiment of the present disclosure.

Hereinafter, embodiments of the present disclosure will be described with reference to the accompanying drawings. In each of the drawings, the same components may be denoted by the same reference numerals, and redundant descriptions thereof may be omitted.

[Plasma Processing Apparatus]

First, a schematic configuration of a plasma processing apparatus 1 according to an embodiment of the present disclosure will be described with reference to FIG. 1. FIG. 1 is a schematic cross-sectional view illustrating an example of a plasma processing apparatus 1 according to an embodiment of the present disclosure. The plasma processing apparatus 1 according to the present embodiment is an apparatus that involves a plurality of continuous operations and executes predetermined processes, such as a film-forming process, a diffusion process, an etching process, and an ashing process, on a substrate W including, for example, a semiconductor wafer for manufacturing a semiconductor device.

The plasma processing apparatus 1 includes a processing container 2, a stage 21, a gas supply mechanism 3, an exhaust apparatus 4, a microwave introduction module 5, and a controller 8. The processing container 2 accommodates a substrate W and processes the substrate W therein using plasma. The stage 21 is disposed inside the processing container 2 and has a placement surface 21a on which the substrate W is placed. The gas supply mechanism 3 supplies gas into the processing container 2. The exhaust apparatus 4 depressurizes and exhausts an interior of the processing container 2. The microwave introduction module 5 introduces microwaves for generating plasma in the processing container 2. The controller 8 controls each part of the plasma processing apparatus 1.

The processing container 2 has, for example, a substantially cylindrical shape. The processing container 2 is made of a metal material such as aluminum or an alloy thereof. The microwave introduction module 5 is provided at an upper portion of the processing container 2 and introduces electromagnetic waves (microwaves in the present embodiment) into the processing container 2 to generate plasma.

The processing container 2 includes a plate-shaped ceiling wall 11, a bottom wall 13, and a side wall 12 interconnecting the ceiling wall 11 and the bottom wall 13. The ceiling wall 11 is removable from the processing container 2 and has a plurality of openings 11a (portions where microwave introduction windows 73 are disposed). The side wall 12 includes a carry-in/out port 12a for performing carry-in/out of a substrate W to/from a transport chamber (not illustrated) adjacent to the processing container 2. A gate valve G is disposed between the processing container 2 and the transport chamber (not illustrated). The gate valve G has a function of opening/closing the carry-in/out port 12a. The gate valve G hermetically seals the processing container 2 in the closed state and enables the transfer of the substrate W between the processing container 2 and the transport chamber (not illustrated) in the opened state.

The bottom wall 13 includes a plurality of (two in FIG. 1) exhaust ports 13a. The plasma processing apparatus 1 further includes exhaust pipes 14 connecting the exhaust ports 13a and the exhaust apparatus 4. The exhaust apparatus 4 includes an APC valve and a high-speed vacuum pump capable of rapidly depressurizing an internal space of the processing container 2 to a predetermined degree of vacuum. Examples of such a high-speed vacuum pump include a turbo molecular pump and the like. By operating the high-speed vacuum pump of the exhaust apparatus 4, the internal space of the processing container 2 is reduced to a predetermined degree of vacuum, for example, 0.133 Pa.

The plasma processing apparatus 1 further includes a support member 22 that supports the stage 21 in the processing container 2, and an insulating member 23 provided between the support member 22 and the bottom wall 13. The stage 21 is configured to place thereon a substrate W horizontally. The support member 22 has a cylindrical shape extending from the center of the bottom wall 13 toward the internal space of the processing container 2. The stage 21 and the support member 22 are formed of, for example, aluminum or the like having a surface subjected to alumite treatment (anodizing treatment).

The plasma processing apparatus 1 further includes a high-frequency bias power supply 25 that supplies high-frequency electric power to the stage 21, and a matcher 24 provided between the stage 21 and the high-frequency bias power supply 25. The high-frequency bias power supply 25 supplies high-frequency electric power to the stage 21 to draw ions into the substrate W. The matcher 24 includes a circuit configured to match an output impedance of the high-frequency bias power supply 25 with an impedance on the side of a load (on the side of the stage 21). The plasma processing apparatus 1 may further include a temperature control mechanism (not illustrated) configured to heat or cool the stage 21.

The plasma processing apparatus 1 further includes a plurality of gas introduction pipes 16 provided at the ceiling wall 11, and supplies gas into the processing container 2 from gas holes at tip ends of the gas introduction pipes 16. The gas introduction pipes 16 may be provided at the side wall 12.

A gas source 31 is used as a gas source of, for example, a diluting gas for plasma generation, gases used for an oxidation process, a nitriding process, a film-forming process, an etching process, and an ashing process, or the like.

The gas supply mechanism 3 includes a gas supply apparatus 3a including a gas source 31, and pipes 32 connecting the gas source 31 to a plurality of gas introduction pipes 16. Although one gas source 31 is illustrated in FIG. 1, the gas supply apparatus 3a may include a plurality of gas sources according to types of used gases.

The gas supply apparatus 3a further includes a mass flow controller (not illustrated) and an opening/closing valve (not illustrated) provided in the middle of each pipe 32. The types of gases supplied into the processing container 2, flows rate of these gases, and the like are controlled by the mass flow controllers and the opening/closing valves.

Each component of the plasma processing apparatus 1 is connected to the controller 8 to be controlled by the controller 8. The controller 8 is a computer. The controller 8 includes a process controller 81 including a CPU, a user interface 82 connected to the process controller 81, and a storage part 83.

The process controller 81 is a control means that controls respective components relating to process conditions such as temperature, pressure, gas flow rate, high-frequency electric power for applying bias, and microwave output in the plasma processing apparatus 1. Examples of respective components include a high-frequency bias power supply 25, a gas supply apparatus 3a, an exhaust apparatus 4, a microwave introduction module 5, and the like.

The user interface 82 includes a keyboard and a touch panel on which a process manager performs a command input operation or the like to manage the plasma processing apparatus 1, a display that visualizes and displays an operating situation of the plasma processing apparatus 1, and the like.

The storage part 83 stores control programs to perform various processes executed by the plasma processing apparatus 1 under the control of the process controller 81, recipes in which processing condition data and the like are recorded, and the like. The process controller 81 calls and executes an arbitrary control program or a recipe from the storage part 83 as necessary, for example, in response to an instruction from the user interface 82. As a result, under the control of the process controller 81, the gas is converted into a plasma in the processing container 2 of the plasma processing apparatus 1 and a desired process is performed on the substrate W.

The above-described control programs and recipes may be used, for example, in a state of being stored in a computer-readable storage medium such as a flash memory, a DVD, or a Blu-ray disk. Further, the above-described recipes may be transmitted at any time from another device, for example, via a dedicated line, and used online.

Figure 2:
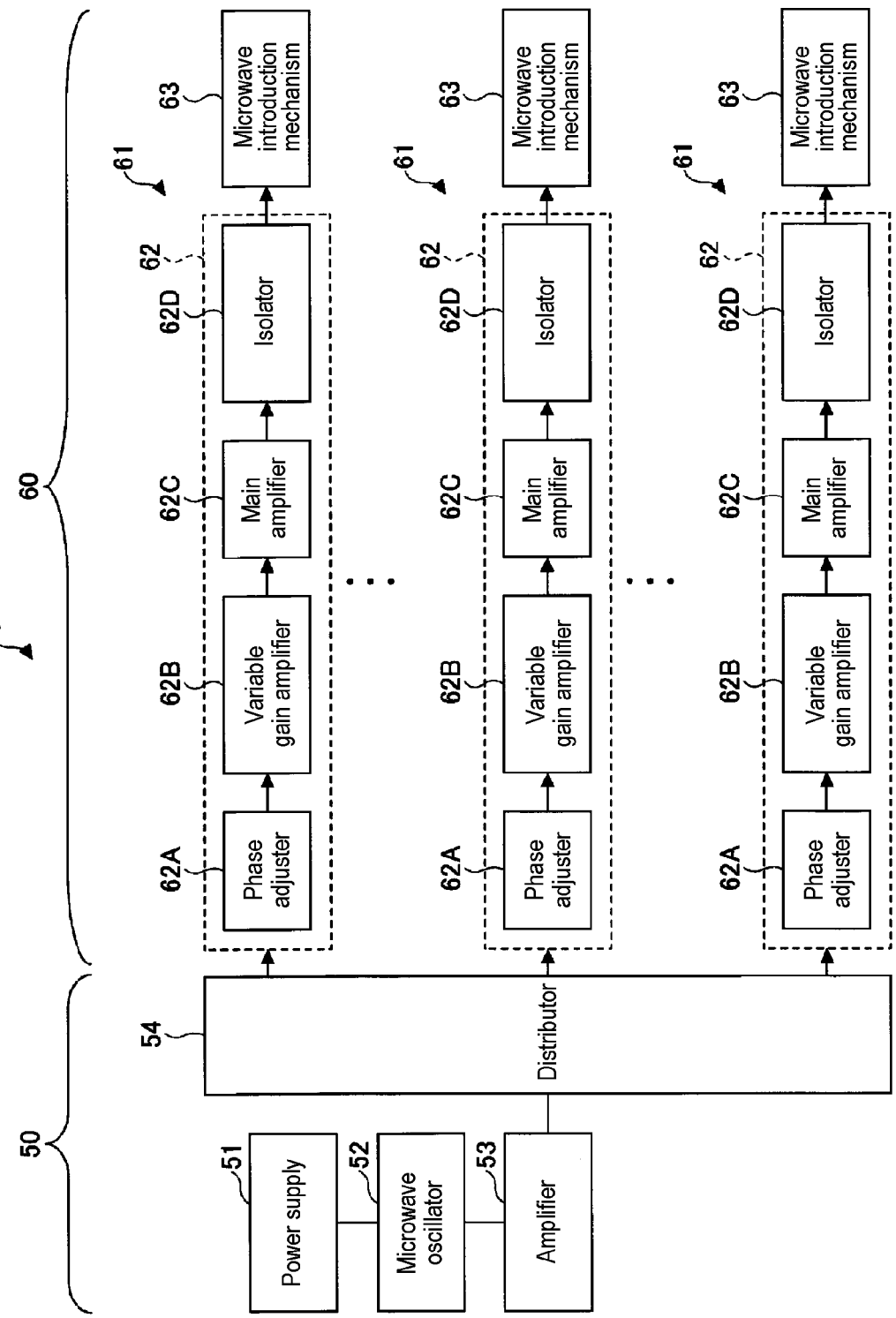
FIG. 2 is an explanatory view illustrating a configuration of a microwave introduction module illustrated in FIG. 1.
Figure 3:
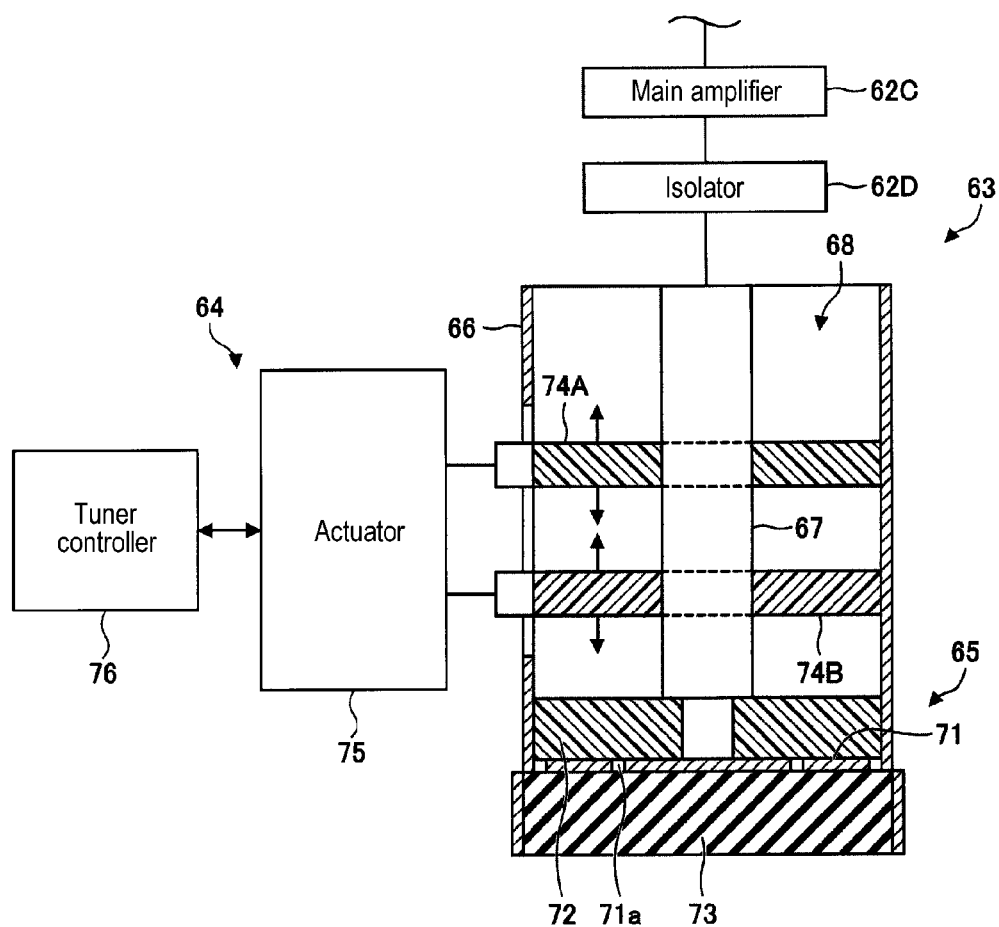
FIG. 3 is a cross-sectional view illustrating the microwave introduction mechanism illustrated in FIG. 1.

Next, a configuration of the microwave introduction module 5 will be described with reference to FIGS. 1 to 3. FIG. 2 is an explanatory view illustrating the configuration of the microwave introduction module 5 illustrated in FIG. 1. FIG. 3 is a cross-sectional view illustrating details of the microwave introduction mechanism 63 illustrated in FIG. 1.

The microwave introduction module 5 is provided at the upper portion of the processing container 2 to introduce microwaves into the processing container 2. As illustrated in FIG. 1, the microwave introduction module 5 includes a ceiling wall 11 which is a conductive member, a microwave output part 50, and an antenna unit 60. The ceiling wall 11 is disposed at the upper portion of the processing container 2 and includes a plurality of openings 11a. The microwave output part 50 generates microwaves and distributes and outputs the microwaves to a plurality of paths. The antenna unit 60 introduces the microwaves output from the microwave output part 50 into the processing container 2.

As illustrated in FIG. 2, the microwave output part 50 includes a power supply 51, a microwave oscillator 52, an amplifier 53 configured to amplify microwaves oscillated by the microwave oscillator 52, and a distributor 54 configured to distribute the microwaves amplified by the amplifier 53 into the multiple paths. The microwave oscillator 52 oscillates microwaves at a predetermined frequency (e.g., 2.45

GHz). The frequency of the microwaves is not limited to 2.45 GHz, but may be 8.35 GHz, 5.8 GHz, 1.98 GHz, or the like. In addition, the microwave output part 50 is also applicable when the frequency of the microwaves is within the range of 800 MHz to 1 GHz, for example, 860 MHz or the like. The distributor 54 distributes the microwaves while matching impedances on the input side and the output side.

The antenna unit 60 includes a plurality of antenna modules 61. Each of the plurality of antenna modules 61 introduces the microwaves distributed by the distributor 54 into the processing container 2. In the present embodiment, configurations of the plurality of antenna modules 61 are all the same. Each antenna module 61 includes an amplifier part 62 that mainly amplifies and outputs the distributed microwaves, and a microwave introduction mechanism 63 that introduces the microwaves output from the amplifier part 62 into the processing container 2. The antenna module 61 is disposed on the ceiling wall 11 of the processing container 2 and introduces microwaves into the processing container 2.

The amplifier part 62 includes a phase adjuster 62A, a variable gain amplifier 62B, a main amplifier 62C, and an isolator 62D. The phase adjuster 62A changes the phase of microwaves. The variable gain amplifier 62B adjusts a power level of the microwaves input to the main amplifier 62C. The main amplifier 62C is configured as a solid-state amplifier. The isolator 62D separates the reflected microwaves reflected by the antenna part of the microwave introduction mechanism 63 and directed toward the main amplifier 62C.

The phase adjuster 62A changes the phase of the microwaves to change radiation characteristics of the microwaves. The phase adjuster 62A is used to control a directivity of the microwaves and to change the distribution of plasma by, for example, adjusting the phase of microwaves for each antenna module 61. When the adjustment of radiation characteristics is not performed, the phase adjuster 62A may not be provided.

The variable gain amplifier 62B is used to adjust a variation of each antenna module 61 or adjust a plasma intensity. For example, by changing the variable gain amplifier 62B for each antenna module 61, the distribution of plasma in the entire processing container 2 may be adjusted.

The main amplifier 62C includes, for example, an input matching circuit, a semiconductor amplification element, an output matching circuit, and a high-Q resonance circuit (not illustrated). As the semiconductor amplification element, for example, a GaAsHEMT, a GaNHEMT, or a laterally diffused MOS (LD-MOS) capable of performing an E-class operation is used.

The isolator 62D includes a circulator and a dummy load (a coaxial terminator). The circulator guides reflected microwaves reflected by the antenna part of the microwave introduction mechanism 63 to the dummy load. The dummy load converts the reflected microwaves guided by the circulator into heat. As described above, in the present embodiment, a plurality of antenna modules 61 are provided, and the plurality of microwaves introduced into the processing container 2 by the microwave introduction mechanism 63 of each of the plurality of antenna modules 61 are synthesized in the processing container 2. Therefore, each isolator 62D may be of a compact type, and may be provided adjacent to the main amplifier 62C.

A plurality of microwave introduction mechanisms 63 are provided in the openings 11a in the ceiling wall 11 as illustrated in FIG. 1. As illustrated in FIG. 3, the microwave introduction mechanism 63 includes a tuner 64 that matches an impedance and an antenna part 65 that radiates amplified microwaves into the processing container 2. In addition, the microwave introduction mechanism 63 includes a main body container 66 made of a metal material and having a cylindrical shape extending in the vertical direction and an inner conductor 67 extending in the main body container 66 in the same direction as the direction in which the main body container 66 extends. The main body container 66 and the inner conductor 67 form a coaxial tube. The main body container 66 constitutes an outer conductor of this coaxial tube. The inner conductor 67 has a rod shape or cylindrical shape. A space between an inner peripheral surface of the main body container 66 and an outer peripheral surface of the inner conductor 67 forms a microwave transmission path 68.

The antenna module 61 further includes a power-feeding conversion part (not illustrated) provided on the side of a base end (an upper end side) of the main body container 66. The power-feeding conversion part is connected to the main amplifier 62C via a coaxial cable. The isolator 62D is provided in the middle of the coaxial cable. The antenna part 65 is provided on the opposite side of the power-feeding conversion part in the main body container 66. The portion of the main body container 66 closer to the base end than the antenna part 65 is within a range of impedance adjustment by the tuner 64.

The antenna part 65 includes a planar antenna 71, which is connected to the lower end portion of the inner conductor 67, a microwave retardation member 72 disposed on the side of a top surface of the planar antenna 71, and a microwave introduction window 73 disposed on the side of a bottom surface of the planar antenna 71. The bottom surface of the microwave introduction window 73 is exposed to the internal space of the processing container 2. The microwave introduction window 73 is provided in the opening 11a of the ceiling wall 11 and supplies the power of the microwave into the processing container 2.

The flat antenna 71 has a disk shape. In addition, the planar antenna 71 includes slots 71a formed to penetrate the planar antenna 71. In an example, four slots 71a are provided, and each slot 71a has an arc shape evenly divided into four. The number of slots 71a is not limited to four, and may be five or more, or one or more and three or less.

The microwave retardation member 72 is formed of a material having a dielectric constant larger than that of vacuum. As the material for forming the microwave retardation member 72, for example, quartz, ceramics, a fluorine-based resin such as polytetrafluoroethylene resin, a polyimide resin, or the like may be used. The wavelength of microwaves becomes longer in vacuum. The microwave retardation member 72 has a function of adjusting the plasma by shortening the wavelength of the microwaves. In addition, the phase of the microwaves changes according to a thickness of the microwave retardation member 72. Therefore, by adjusting the phase of the microwaves according to the thickness of the microwave retardation member 72, the planar antenna 71 may be adjusted to be at a position of an antinode of a standing wave. This makes it possible to suppress reflected waves in the planar antenna 71, and to increase a radiation energy of the microwaves radiated from the planar antenna 71. That is, this makes it possible to efficiently introduce the power of microwaves into the processing container 2.

The microwave introduction window 73 is made of a dielectric material. As the dielectric material for forming the microwave introduction window 73, for example, quartz, ceramics, or the like is used. The microwave introduction window 73 has a shape that enables microwaves to be efficiently radiated in a TE mode. The shape of the microwave introduction window 73 may be a rectangular parallelepiped shape, a cylindrical shape, a pentagonal pillar shape, a hexagonal pillar shape, or an octagonal pillar shape.

In the microwave introduction mechanism 63 having such a configuration, the microwaves amplified by the main amplifier 62C reaches the planar antenna 71 via the microwave transmission path 68 between the inner peripheral surface of the main body container 66 and the outer peripheral surface of the inner conductor 67. Then, the microwaves are transmitted from the slot 71a in the flat antenna 71 through the microwave introduction window 73 and radiated into the internal space of the processing container 2.

The tuner 64 constitutes a slug tuner. Specifically, as illustrated in FIG. 3, the tuner 64 includes two slugs 74A and 74B disposed in a portion closer to the base end (the upper end) than the antenna portion 65 of the main body container 66. In addition, the tuner 64 includes an actuator 75 that operates the two slugs 74A and 74B, and a tuner controller 76 that controls the actuator 75.

The slugs 74A and 74B have a planar and annular shape, and are disposed between the inner peripheral surface of the main body container 66 and the outer peripheral surface of the inner conductor 67. In addition, the slugs 74A and 74B are formed of a dielectric material. As the dielectric material forming the slugs 74A and 74B, for example, high-purity alumina having a relative permittivity of 10 may be used. The high-purity alumina has a relative permittivity higher than that of quartz (having a relative permittivity of 3.88) or Teflon (registered trademark) (having a relative permittivity of 2.03), which are usually used as materials for forming slugs, and therefore, thicknesses of the slugs 74A and 74B may be reduced. In addition, the high-purity alumina is characterized in that that a dielectric loss tangent (tan δ) thereof is smaller than that of quartz or Teflon (registered trademark) such that a microwave loss may be reduced. The high-purity alumina is also characterized in that it is less distorted and is resistant to heat. As the high-purity alumina, an alumina sintered body having a purity of 99.9% or more is preferable. In addition, single crystal alumina (sapphire) may be used as the high-purity alumina.

The tuner 64 moves the slugs 74A and 74B in the vertical direction by the actuator 75 based on a command from the tuner controller 76. As a result, the tuner 64 adjusts the impedance. For example, the tuner controller 76 adjusts the positions of the slugs 74A and 74B such that the impedance of the terminal portion becomes, for example, 50Ω.

In the present embodiment, the main amplifier 62C, the tuner 64, and the planar antenna 71 are disposed close to each other. In particular, the tuner 64 and the planar antenna 71 form a lumped constant circuit and function as a resonator. An impedance mismatch exists in an installation portion of the planar antenna 71. In the present embodiment, since it is possible to perform high-accuracy tuning including plasma by the tuner 64, thereby eliminating an influence of reflection on the planar antenna 71. In addition, since it is possible to eliminate impedance mismatch up to the planar antenna 71 with high accuracy by the tuner 64, thereby substantially using a mismatched portion as a plasma space. This makes it possible to perform highly-accurate plasma control by the tuner 64.

[Groove Shape in Ceiling Wall]

Next, with reference to FIGS. 4A and 4B, the bottom surface of the ceiling wall 11 illustrated in FIG. 1 will be described. FIG. 4A is a cross-sectional view taken along line I-I of FIG. 1, illustrating an example of grooves on the ceiling wall according to an embodiment of the present disclosure, and FIG. 4B illustrates an example of grooves on a ceiling wall according to a comparative example. That is, FIG. 4A is a view illustrating an example of grooves 70a and 70b formed on the ceiling wall 11 of FIG. 1. In the following description, it is assumed that the microwave introduction windows 73 have a cylindrical shape. In addition, on the bottom surfaces of the ceiling walls 11 of FIGS. 4A to 7B, illustration of gas holes is omitted.

A plurality of microwave introduction windows 73 are disposed on one virtual plane parallel to the placement surface 21a of the stage 21 in the state of being fitted to a plurality of openings 11a in the ceiling wall 11. In addition, the plurality of microwave introduction windows 73 include three microwave introduction windows 73 in which distances between center points of the microwave introduction windows 73 are equal to or substantially equal to one other in the virtual plane. The description that the distances between the center points of the microwave introduction windows 73 are substantially the same means that the position of the microwave introduction window 73 may be slightly deviated from a desired position from the viewpoint of a shape accuracy of the microwave introduction windows 73 or an assembly accuracy of the microwave introduction mechanism 63.

In the present embodiment, the plurality of microwave introduction windows 73 include seven microwave introduction windows 73 disposed to form a hexagonal tightest arrangement. Specifically, surrounding microwave introduction windows 73 are arranged such that center points of the surrounding microwave introduction windows 73 coincide with or substantially coincide with vertices of a regular hexagon respectively. A central microwave introduction window 73 is arranged such that a center point of the central microwave introduction window 73 coincides with or substantially coincides with a center of the regular hexagon. The description that the center points of the surrounding microwave introduction windows 73 substantially coincide with the vertices of the regular hexagon or the center point of the central microwave introduction window 73 substantially coincides with the center of the regular hexagon means that the center points of the microwave introduction windows 73 may be slightly deviated from the vertices or the center from the viewpoint of the shape accuracy of the microwave introduction window 73, the assembly accuracy of the microwave introduction mechanism 63 or the like.

The six surrounding microwave introduction windows 73 are arranged at outer sides of the central portion of the ceiling wall 11 to surround one central microwave introduction window 73. In the present embodiment, the "central portion in the ceiling wall 11" means the "central portion in the planar shape of the ceiling wall 11."

In the present embodiment, as illustrated in FIG. 4A, a groove 70a and grooves 70b are formed on the ceiling wall 11 to respectively surround the openings 11a in the ceiling wall 11. Hereinafter, the groove 70a and the grooves 70b may be collectively referred to as grooves 70.

The groove 70a is formed to surround the opening 11a into which the central microwave introduction window 73 is fitted. The groove 70a has a true circular shape, and the width between the groove 70a and the opening 11a (the distance between the inner circumference of the groove 70a and the edge of the opening 11a) is uniform in the peripheral direction (circumferential direction) of the opening 11a.

The grooves 70b are formed to surround the openings 11a into which the surrounding microwave introduction windows 73 are fitted, respectively. Each groove 70b has an elliptical shape, and the width between the groove 70b and the corresponding opening 11a (the distance between the inner circumference of each groove 70b and the edge of the corresponding opening 11a) is not uniform in the circumferential direction of the opening 11a. In the example of FIG. 4A, each groove 70b is formed in a shape of an ellipse such that a long diameter of the ellipse is oriented in the circumferential direction of the ceiling wall 11. Therefore, the width between each groove 70b and the corresponding opening 11a becomes wider in the circumferential direction of the ceiling wall 11 indicated by the broken line Ci in FIG. 4A, and becomes narrower in the radial direction of the ceiling wall 11. However, the present disclosure is not limited thereto, and each groove 70b may be formed such that the long diameter of the ellipse is oriented in the radial direction of the ceiling wall 11. In this case, the width between each groove 70b and the corresponding opening 11a becomes narrower in the circumferential direction of the ceiling wall 11 indicated by the broken line Ci in FIG. 4A, and becomes wider in the radial direction of the ceiling wall 11.

FIG. 4B illustrates the shapes of the grooves 170a and 170b of a comparative example. In the comparative example, as illustrated in FIG. 4B, a groove 170a and grooves 170b are formed on the ceiling wall 11 to surround respectively the openings 11a in the ceiling wall 11. The groove 170a is formed to surround the opening 11a into which the central microwave introduction window 73 is fitted. The groove 70a has a true circular shape, and the width between the groove 70a and the opening 11a is uniform in the circumferential direction of the opening 11a.

The grooves 170b are formed to surround the openings 11a into which the surrounding microwave introduction windows 73 are fitted, respectively. Each groove 170b also has a true circular shape, and the width between the groove 170b and the corresponding opening 11a is uniform in the circumferential direction of the opening 11a.

The graph of FIG. 4B shows a density Ne of plasma formed below the ceiling wall 11 when the groove 170a and the grooves 170b in the comparative example of FIG. 4B were formed. The graph of FIG. 4A shows a density Ne of the plasma formed below the ceiling wall 11 when the groove 70a and the grooves 70b in the present embodiment of FIG. 4A were formed.

A horizontal axis of each of the graphs of FIGS. 4A and 4B represents an angle θ in the circumferential direction from 0 to 360 degrees when a position of one end of an axis GV passing through the center of the ceiling wall 11 is 0 degrees, and a vertical axis thereof represents plasma density Ne below the circumference of the ceiling wall 11, shown by the broken line Ci.

According to the above, when the grooves 70a and 70b; 170a and 170b are formed on a rear surface of the ceiling wall 11 (with grooves in line B and line C in the graphs), it is possible to make a cutoff efficiency of electric field of surface wave plasma higher than that when grooves are absent (without grooves in lines A in the graphs). That is, the surface wave plasma may be confined inside the grooves 70a and 70b; 170a and 170b. Therefore, when the grooves are formed on the ceiling wall 11, as shown by the line B and the line C in the graphs, an upper limit of the plasma density Ne inside the grooves is higher than that of the plasma density Ne when the grooves are not formed on the ceiling wall 11, shown by the lines A in the graphs. Since there is a relative relationship between the plasma density Ne and a film-forming rate, by forming grooves on the ceiling wall 11, it is possible to increase the plasma density Ne inside the grooves to improve the film-forming rate.

However, as shown in FIG. 4B, when the grooves 170a and 170b have a true circular shape, the uniformity of the plasma density Ne deteriorates as shown by the line B. Therefore, in the present embodiment, as shown in FIG. 4A, the grooves 70b are formed in an elliptical shape. As a result, as shown in the line C, the uniformity of the plasma density distribution in the circumferential direction may be improved compared with the line B.

By making the plasma density distribution in the circumferential direction uniform in this way, it is possible to improve the uniformity of a film thickness in the circumferential direction while maintaining the plasma density Ne and the film-forming speed.

[Modifications of Grooves]
(Open Portion)

However, the shape of the grooves 70 is not limited to the ellipse. Next, another example of the shape of the grooves 70 will be described with reference to FIGS. 5A to 7B. FIGS. 5A, 5B, 6A, 6B, 7A, and 7B are views illustrating other examples of the grooves 70 in the ceiling wall 11 according to the embodiment of the present disclosure. A horizontal axis of each of the graphs of FIGS. 5A and 5B represents an angle θ in the circumferential direction from 0 to 360 degrees when a position of one end of an axis GV passing through the center of the ceiling wall 11 is 0 degrees, and a vertical axis thereof represents the plasma density Ne below the circumference of the ceiling wall 11 indicated by the broken line Ci. For example, as illustrated in FIG. 5A, each groove 70b may have a non-recessed open portion 70b1 in a portion of the groove surrounding the corresponding opening 11a. The open portions 70b1 may be formed at facing positions of openings 11a adjacent to each other in the circumferential direction of the ceiling wall 11 or in the vicinities of the facing positions. As a result, a part of surface wave plasma propagates from the open portions 70b1 to the outside of the grooves 70b, whereby a decrease in the plasma density Ne outside the grooves 70b may be suppressed as shown by a line D in the graph of FIG. 5A, and the uniformity of the plasma density distribution in the circumferential direction may be improved.

For example, as illustrated in FIG. 5B, a substantially star-shaped groove 70a may be provided. The groove 70a in FIG. 5B has portions 70a2 respectively arched toward spaces between adjacent two of six surrounding openings 11a and portions 70a1 respectively recessed slightly from the six surrounding openings 11a. As a result, in the portions 70a2 of the groove 70a, the width (distance) from the surrounding openings 11a to the groove 70 is increased for regions in which the plasma density is relatively low between the surrounding openings 11a. In addition, in the portions 70a1 of the groove 70a, the width (distance) from the surrounding openings 11a to the groove 70 is reduced for regions in which the surrounding openings 11a are present and the plasma density is relatively high. As a result, as shown by line E in the graph of FIG. 5B, the uniformity of the plasma density distribution in the circumferential direction may be further improved.

(Confinement in Circle)

In FIG. 5B, a groove 70c covering all the openings 11a is formed on the outer periphery of the six surrounding openings 11a. The groove 70c has a true circular shape. As a result, the plasma density Ne may be increased by confining surface wave plasma in the groove 70c. However, the groove 70c may not be provided. In addition, although grooves 70b are not provided for the six surrounding openings 11a, the grooves 70b may be provided for the six surrounding openings 11a, respectively. In this case, the grooves 70b may be preferably formed in an elliptical shape, but may have a true circular shape. The number of grooves 70 may be one or more to surround at least one of the plurality of openings 11a in the ceiling wall 11.

(Bias of Groove)

The grooves 70 may be formed to be biased outward or inward with respect to the opening 11a in the ceiling wall 11. For example, as illustrated in FIGS. 6A and 6B, a groove 70 is formed for each of the plurality of openings 11a in the ceiling wall 11, and at least one of the grooves 70 formed for the plurality of openings 11a may be formed to be biased toward the outer peripheral side or the inner peripheral side with respect to the openings 11a. In the example of FIG. 6A, an elliptical groove 70b is formed for each of the surrounding openings 11a, and the long-diameter direction of each groove 70b coincides with the radial direction. In addition, each groove 70b is formed to be biased outward to be widened outward with respect to the corresponding opening 11a. The groove 70a has a true circular shape.

In the example of FIG. 6B as well, an elliptical groove 70b is formed for each of the surrounding openings 11a, and the long-diameter direction of each groove 70b coincides with the radial direction. However, each groove 70b is formed to be biased inward to be widened inward with respect to the corresponding opening 11a. In this case as well, the groove 70a has a true circular shape.

A horizontal axis of each of the graphs of FIGS. 6A and 6B represents a radial position R (mm) from the center O to the edge E of the ceiling wall 11 of FIGS. 6A and 6B, and a vertical axis thereof represent plasma density Ne at the position R. When there are no grooves 70 for the openings 11a, the plasma density Ne increases at the edge E of the ceiling wall 11 as shown by line A in the graph of FIG. 6A, or the plasma density Ne decreases at the edge E of the ceiling wall 11 as shown by line A in the graph of FIG. 6B. The high level and low level of plasma density Ne at this edge E depends on the process conditions. As an example, when a pressure in the processing container 2 is high (e.g., 20 Pa or higher), the plasma density Ne at the edge E increases, and when the pressure is lower than that (e.g., less than 20 Pa), the plasma density at the edge E falls. In addition, the plasma density Ne at the edge E may fall by increasing the power of microwaves or changing the diluting gas from He gas to Ar gas. In FIGS. 6A and 6B, the elliptical grooves 70b are formed to be biased outward or inward with respect to the openings 11a to correct the increase or decrease of plasma density Ne at the edge E.

For example, in the case of FIG. 6A in which the elliptical grooves 70b are formed to be biased outward, as illustrated in the upper portion of FIG. 6A, a composite wave of a surface wave Sa propagating inside the groove 70a and a surface wave Sb propagating inside the grooves 70b is generated. The plasma density Ne from the center O to the edge E of the ceiling wall 11 is proportional to this composite wave. In FIG. 6A, by forming the elliptical grooves 70b to be biased outward with respect to the openings 11a, the surface wave Sb propagates to the outside of the surface wave Sb' shown by the dotted line in the case of the true-circular grooves 70. As a result, as shown by line F in the graph of FIG. 6A, the plasma density Ne at the edge E may be made more uniform than in the case of the true-circular grooves 70. As a result, it is possible to suppress the increase of the plasma density Ne at the edge E that occurs when there is no groove in the graph of FIG. 6A (line A), and to make the plasma density distribution in the radial direction of the ceiling wall 11 uniform.

Similarly, as shown in FIG. 6B, by forming the elliptical grooves 70b to be biased inward, the plasma density Ne at the edge E may be made uniform as shown by the line G in the graph of FIG. 6B. As a result, it is possible to suppress the decrease of the plasma density Ne at the edge E that occurs when there is no groove in the graph of FIG. 6B (line A), and to make the plasma density distribution in the radial direction of the ceiling wall 11 uniform.

(Other Examples of Grooves)

Figure 7A:
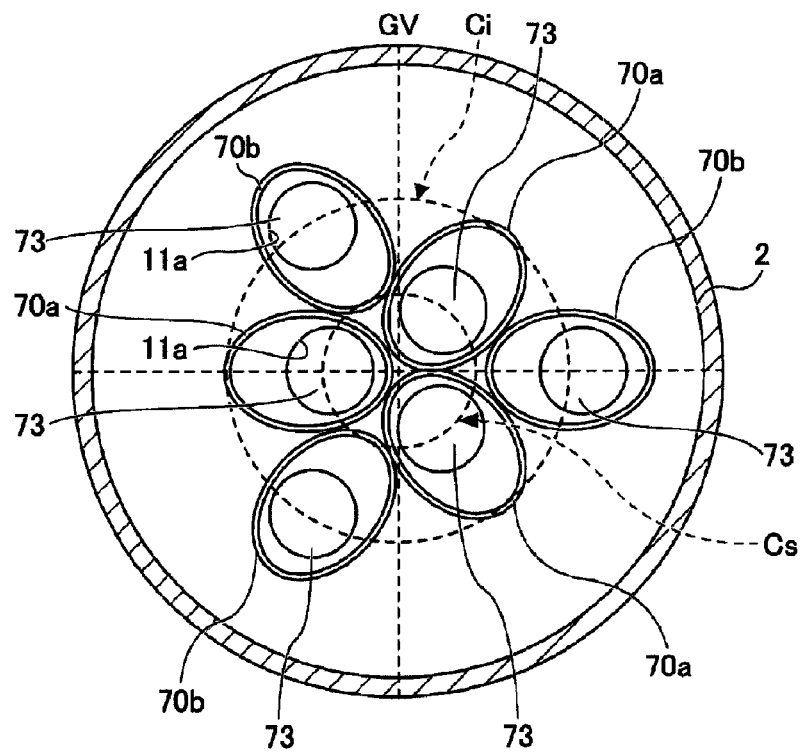
FIG. 7A is a view illustrating another example of grooves in a ceiling wall according to an embodiment of the present disclosure.

Other examples of grooves 70 will be described with reference to FIGS. 7A and 7B. In the example of FIG. 7A, a groove 70b is formed around each of three openings 11a arranged in the circumferential direction of the ceiling wall 11 indicated by the broken line Ci. The grooves 70b have an elliptical shape and are formed to be biased inward with respect to the openings 11a. In addition, a groove 70a is formed around each of three openings 11a arranged in the circumferential direction of the ceiling wall 11 indicated by the broken line Cs inside the broken line Ci. The grooves 70a have an elliptical shape and are formed to be biased outward with respect to the openings 11a. In this way, by forming the grooves 70 in the form of ellipses such that the ellipses are biased inward or outward according to the positions of the openings 11a in the ceiling wall 11, the region in which the plasma density NE is low and the region in which the plasma density NE is high may be freely complemented according to the size of the width between the grooves 70 and the openings 11a, and the plasma density distribution may be made uniform regardless of the positions of the openings 11a formed in the ceiling wall 11.

As described above, the ceiling wall 11 according to the present embodiment and the plasma processing apparatus 1 in which the ceiling wall 11 is disposed include microwave introduction windows 73 provided to close openings 11a in the ceiling wall 11 and grooves 70 formed in the ceiling wall 11 to surround respectively the openings 11a in the ceiling wall 11. The width between each groove 70 and the corresponding opening 11a is not uniform in the circumferential direction of the opening 11a. As a result, it is possible to make plasma density distribution uniform while maintaining an improvement in the plasma density Ne or the film-forming speed.

Figure 7B:
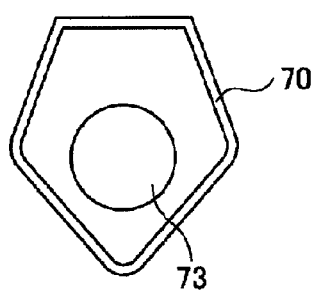
FIG. 7B is a view illustrating another example of grooves in a ceiling wall according to an embodiment of the present disclosure.

The shape of the grooves 70 is not limited to an elliptical shape or a star shape, the grooves 70 may have a pentagonal shape of which sides are not the same in length or a regular pentagonal shape as shown in FIG. 7B, or may a polygonal shape such as a hexagonal shape or an octagonal shape, or other shapes. In addition, various grooves 70 described above may be combined and formed on the ceiling wall 11.

Among the plurality of openings 11a, the groove 70a formed in the central opening 11a and the grooves 70b formed in the openings 11a around the central opening 11a may have different shapes. In addition, the grooves 70 may be arranged point-symmetrically with respect to the center of the ceiling wall 11.

In addition, radial widths between the grooves 70 and the openings 11a may differ according to a refractive index (RI) of a film generated on a processed substrate W, a thickness of the film, or a plasma density Ne when the substrate W is processed. Concerning the different widths, the radial width between one groove 70 and the corresponding opening 11a may be wide or narrow, or among radial widths between a plurality of grooves 70 and openings 11a, one radial width and other radial widths may differ from each other.

[Depth of Groove]

Figure 8:
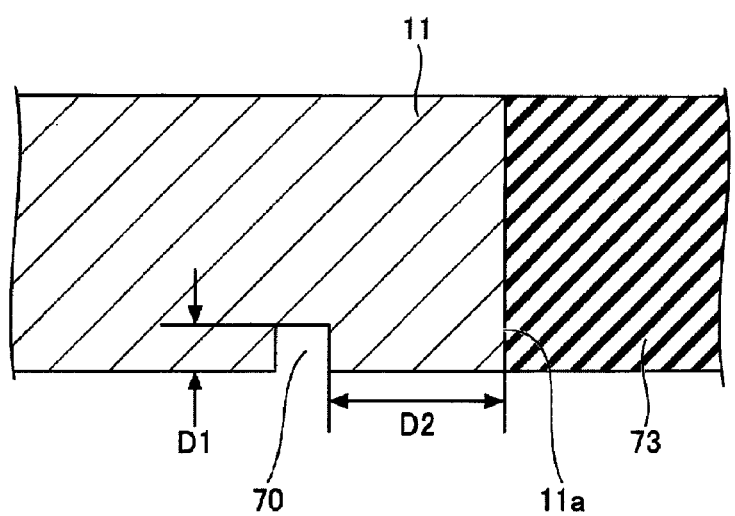
FIG. 8 is a view illustrating an example of a vertical cross section of a groove according to an embodiment of the present disclosure.

Finally, the depth D1 of the grooves 70 will be described with reference to FIG. 8. FIG. 8 is a view illustrating an example of a vertical cross section of a groove 70 according to an embodiment of the present disclosure. It is assumed that a wavelength of a surface wave that passes through a microwave introduction window 73 fitted into an opening 11a and propagates on the rear surface of the ceiling wall 11 is $\lambda_{sp}$. The depth D1 of the groove 70 is preferably $\lambda_{sp}/4$. However, the depth D1 of the groove 70 is not limited to $\lambda_{sp}/4$, and may be in the range of $\lambda_{sp}/4 \pm \lambda_{sp}/8$. When the frequency of microwaves is 860 MHz, $\lambda_{sp}$ is about 10 to 20 mm. In this case, the depth D1 of the groove 70 is about 1.25 mm to 7.5 mm. In addition, the distance D2 from the opening 11a into which the microwave introduction window 73 is fitted to the inner side wall of the groove 70 is 10 mm to 100 mm.

The grooves 70 described above are formed by machining the ceiling wall 11 into an optimum shape according to the process conditions at the time of manufacturing the ceiling wall 11. When the process conditions to be executed in the plasma processing apparatus 1 change, grooves 70 having an appropriate shape according to the new process conditions may be required. In this case, the ceiling wall 11 used in the plasma processing apparatus 1 is replaced with a ceiling wall 11 in which grooves 70 having a shape according to new process conditions are formed. As a result, when the plasma conditions change in the plasma processing apparatus 1, the plasma density distribution during plasma processing maybe made uniform by processing a substrate W by using the ceiling wall 11 in which the grooves 70 according to the plasma conditions are formed.

It should be understood that the plasma processing apparatus and the ceiling wall according to the embodiments of the present disclosure disclosed herein are exemplary in all respects and not restrictive. The embodiments described above may be modified and improved in various forms without departing from the scope and spirit of the appended claims. The matters described in the above-described embodiments may take other configurations without contradiction, and may be combined without contradiction.

As the plasma processing apparatus of the present disclosure, a microwave plasma processing apparatus is used, but any plasma processing apparatus may be used as long as it is a plasma processing apparatus that introduces electromagnetic waves from the openings 11a provided in the ceiling wall 11 through the electromagnetic wave introduction windows to convert a gas into a plasma.

The present international application claims priority based on Japanese Patent Application No. 2019-185445 filed on Oct. 8, 2019, the disclosure of which is incorporated herein in its entirety by reference.

EXPLANATION OF REFERENCE NUMERALS

1: plasma processing apparatus, 2: processing container, 3: gas supply mechanism 4: exhaust apparatus, 5: microwave introduction module, 8: controller, 11: ceiling wall, 11a: opening, 16: gas introduction pipe, 21: stage, 21a: placement surface, 24: matcher, 25: high-frequency bias power supply, 50: microwave output part, 51: power supply, 52: microwave oscillator, 53: amplifier, 54: distributor, 60: antenna unit, 61: antenna module, 62: amplifier part, 63: microwave introduction mechanism, 64: tuner, 65: antenna part, 66: main body container, 67: inner conductor, 71: planar antenna, 71a: slot, 72: microwave retardation member, 73: microwave introduction window, W: substrate

What is claimed is:

1. A plasma processing apparatus that converts a gas supplied into a processing container into a plasma to process a substrate, the plasma processing apparatus comprising:
a microwave introduction window disposed in each of a plurality of openings formed in a ceiling wall of the processing container, the microwave introduction window being configured to supply power of microwaves into the processing container; and
a plurality of grooves formed on the ceiling wall to surround the openings, respectively,
wherein widths between the grooves and the openings are not uniform with respect to circumferential directions of the openings, and
wherein a groove among the plurality of the grooves formed for a central opening among the plurality of openings is different in shape from grooves among the plurality of grooves formed for openings around the central opening.

2. The plasma processing apparatus of claim 1, wherein the grooves have an elliptical shape.

3. The plasma processing apparatus of claim 2, wherein the grooves are formed such that a long diameter of the elliptical shape is oriented in a circumferential direction or a radial direction of the ceiling wall.

4. The plasma processing apparatus of claim 3, wherein the grooves are formed for the plurality of openings respectively, and
wherein at least one of the grooves formed for the plurality of openings is formed to be biased toward an outer peripheral side or an inner peripheral side with respect to at least one of the openings for which the at least one of the grooves is formed.

5. The plasma processing apparatus of claim 4, wherein the grooves include non-recessed open portions in portions of the grooves surrounding the openings.

6. The plasma processing apparatus of claim 5, wherein the open portions are formed at facing positions of the openings adjacent to the open portions or in vicinities of the facing positions.

7. The plasma processing apparatus of claim 6, wherein the widths between the grooves and the openings are different from each other according to a refractive index of a film generated on the processed substrate, a thickness of the film, or a plasma density when the substrate is processed.

8. The plasma processing apparatus of claim 7, wherein the grooves are arranged point-symmetrically with respect to a center of the ceiling wall.

9. The plasma processing apparatus of claim 8, wherein the grooves have a depth of $\lambda_{sp}/4 \pm \lambda_{sp}/8$ where $\lambda_{sp}$ is a wavelength of surface waves of the microwaves.

10. The plasma processing apparatus of claim 1, wherein the grooves are formed for the plurality of openings respectively, and
wherein at least one of the grooves formed for the plurality of openings is formed to be biased toward an outer peripheral side or an inner peripheral side with respect to at least one of the openings for which the at least one of the grooves is formed.

11. The plasma processing apparatus of claim 1, wherein the grooves include non-recessed open portions in portions of the grooves surrounding the openings.

12. The plasma processing apparatus of claim 1, wherein the widths between the grooves and the openings are different from each other according to a refractive index of a film generated on the processed substrate, a thickness of the film, or a plasma density when the substrate is processed.

13. The plasma processing apparatus of claim 1, wherein the grooves are arranged point-symmetrically with respect to a center of the ceiling wall.

14. The plasma processing apparatus of claim 1, wherein the grooves have a depth of $\lambda_{sp}/4 \pm \lambda_{sp}/8$ where $\lambda_{sp}$ is a wavelength of surface waves of the microwaves.

15. A ceiling wall attachable to or detachable from a processing container in which a substrate is processed, the ceiling wall comprising:
- a microwave introduction window disposed in each of a plurality of openings in the ceiling wall, the microwave introduction window being configured to supply power of microwaves into the processing container; and
- a plurality of grooves formed on the ceiling wall to surround the openings, respectively,
- wherein widths between the grooves and the openings are not uniform with respect to circumferential directions of the openings, and
- wherein a groove among the plurality of the grooves formed for a central opening among the plurality of openings is different in shape from grooves among the plurality of grooves formed for openings around the central opening.

\* \* \* \* \*